(12) United States Patent
Parthasarathy et al.

(10) Patent No.: US 7,263,141 B1
(45) Date of Patent: Aug. 28, 2007

(54) CODE MAPPING IN A TRELLIS DECODER

(75) Inventors: Vasudevan Parthasarathy, Indianapolis, IN (US); Kumar Ramaswamy, Indianapolis, IN (US); John Sidney Stewart, Indianapolis, IN (US)

(73) Assignee: Thomson Licensing, Boulogne-Billancourt (FR)

( * ) Notice: Subject to any disclaimer, the term of this patent is extended or adjusted under 35 U.S.C. 154(b) by 0 days.

(21) Appl. No.: 09/391,059

(22) Filed: Sep. 7, 1999

Related U.S. Application Data

(60) Provisional application No. 60/138,232, filed on Jun. 9, 1999.

(51) Int. Cl.
*H03D 1/00* (2006.01)
*H03M 13/03* (2006.01)

(52) U.S. Cl. .................................. 375/341; 714/795
(58) Field of Classification Search ................ 375/341, 375/265, 240.26, 240.05–240.07; 348/21, 348/470, 726; 714/769, 792–796
See application file for complete search history.

(56) References Cited

U.S. PATENT DOCUMENTS

| | | | |
|---|---|---|---|
| 5,233,629 A | 8/1993 | Paik et al. ................ 375/39 |
| 5,408,502 A | 4/1995 | How ...................... 375/340 |
| 5,453,797 A | 9/1995 | Nicolas et al. ............. 348/607 |
| 5,619,540 A * | 4/1997 | Moridi et al. ............. 375/341 |
| 5,621,761 A | 4/1997 | Heegard ................... 375/265 |
| 5,740,203 A * | 4/1998 | Ramaswamy et al. ....... 375/341 |
| 5,914,988 A * | 6/1999 | Hu et al. .................. 375/341 |

OTHER PUBLICATIONS

*Digital Television Standard for HDTV Transmission*, Apr. 12, 1995 I Prepared by the US Avanced Television Systems Committee (ATSC) Containing Sections 4.2.4-4.26, 10.2.3.8-10.2.3.10, 4.2.6-4.2.7, 10.2.3.9-10.2.3.13, 10.3.2-10.3.3.3 and 10.2.3.9.
*TCM in the HDTV Transceiver*, Kim, et al. Of the University of California, Los Angeles, pp. 1-9.
*VSB Modulation Used for Terrestrial and Cable Broadcases*, Gary Sgrignoli, et al. Published in the I.E.E.E. Transactions on Consumer Electronics, vol. 41. No. 3 Aug. 1995.
*Architectural Tradeoffs for Survivor Sequence Memory Management in Viterbi Decoders*, G. Feygin, et al., published in the I.E.E.E. Transactions on Communications, vol. 41, No. 3, Mar. 1993.

\* cited by examiner

*Primary Examiner*—Kevin Kim
(74) *Attorney, Agent, or Firm*—Joseph J. Laks; Ronald H. Kurdyla; Joseph J. Opalach

(57) ABSTRACT

A trellis decoder system uses a feed-forward trellis demapping configuration to prevent error propagation. In a system for processing encoded binary data symbols representable as a symbol constellation, a decoder includes a delay for delaying received encoded symbol data. The decoder also includes a re-encoder for re-coding decoded symbol representative data and a processor for deriving decoded symbol data. The processor derives decoded symbol data using the delayed encoded symbol data and re-encoded data representative of a difference between successive symbols computed using an error propagation-free, feed-forward configuration.

18 Claims, 11 Drawing Sheets

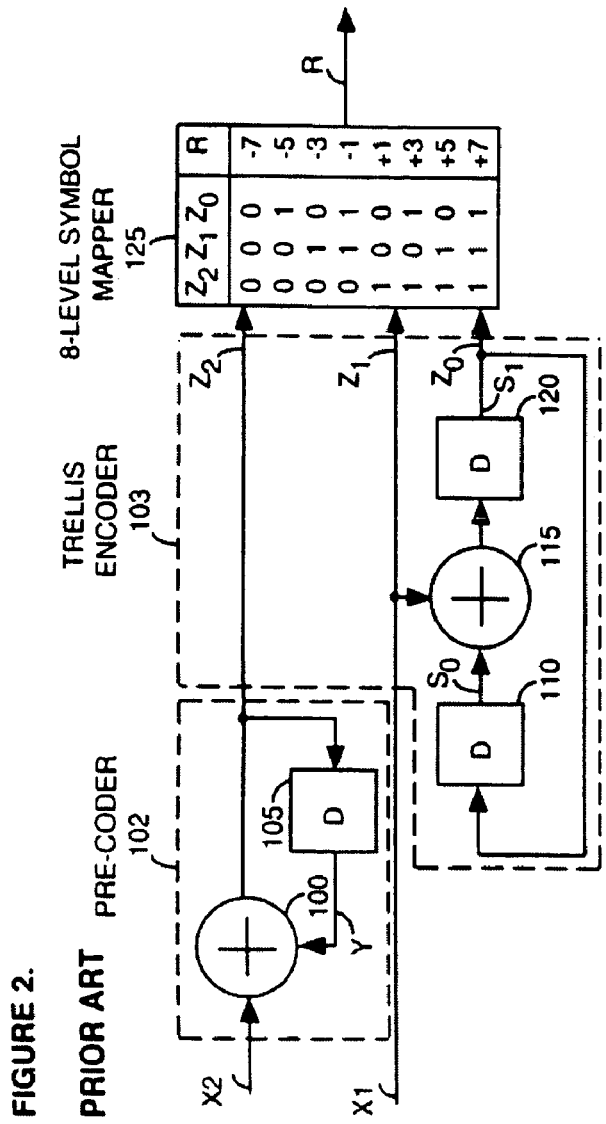

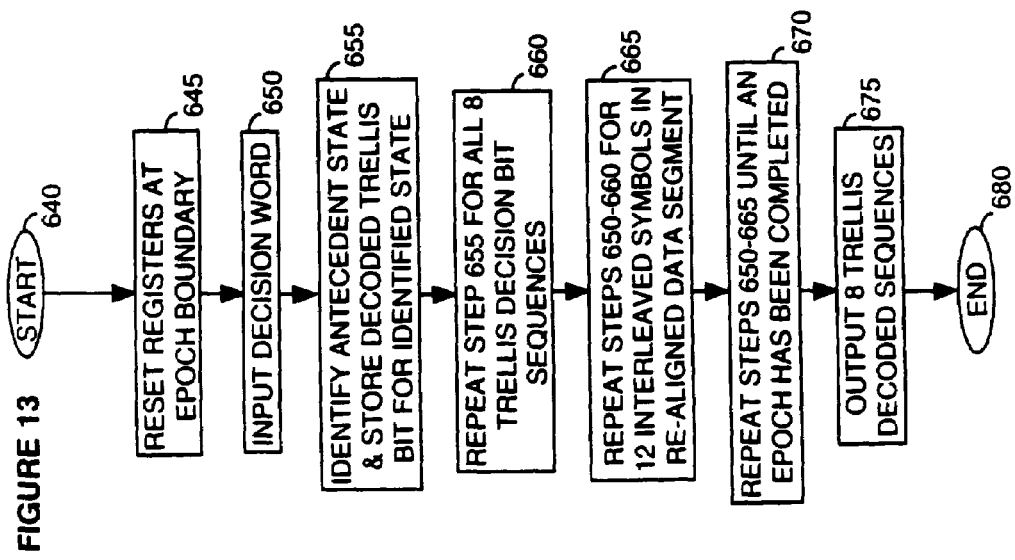

CODE MAPPING IN A TRELLIS DECODER

This is a non-provisional application of provisional application Ser. No. 60/138,232 by K. Ramaswamy et al, filed 9 Jun. 1999.

FIELD OF THE INVENTION

This invention is related to the field of digital signal processing, and more particularly to a trellis decoder suitable for decoding multiple mode trellis encoded High Definition Television (HDTV) type signals, for example.

BACKGROUND OF THE INVENTION

In broadcast and communication applications, trellis coding is employed to improve signal noise immunity. Trellis coding is used in combination with other techniques to protect against particular noise sources. One of these techniques is data interleaving, which is used to protect against interference bursts that may occur during transmission. In this technique, data is arranged (interleaved) in a prescribed sequence prior to transmission, and the original sequence is restored (deinterleaved) upon reception. This operation spreads or disperses the data in time in a predetermined sequence, such that a data loss during transmission does not result in a loss of contiguous data. Instead, any data lost is dispersed and is therefore more easily concealed or corrected. Another technique used to provide interference immunity is interference rejection filtering, which may be used to protect a signal against data dependent cross-talk and co-channel interference.

Trellis coding requirements for high definition television in the United States are presented in sections 4.2.4-4.2.6 (Annex D), 10.2.3.9, 10.2.3.10 and other sections of the *Digital Television Standard for HDTV Transmission* of Apr. 12, 1995, prepared by the United States Advanced Television Systems Committee (ATSC) (hereinafter referred to as the HDTV Standard). The HDTV Standard presents a trellis coding system that employs an interleaving function involving 12 parallel trellis encoders at a transmitter and 12 parallel trellis decoders at a receiver for processing 12 interleaved datastreams. The HDTV Standard trellis coding system also employs an interference rejection filter at a receiver decoder to attenuate cross-talk and co-channel interference associated with NTSC frequencies. The rejection filter as specified by the HDTV Standard is optional and may be applied dynamically depending on the particular data being decoded.

The use of an interleaved code or dynamically selectable filter functions together with trellis decoding introduces additional trellis decoder design constraints and operating modes. These additional design constraints and operating modes significantly complicate the design and implementation of the trellis decoding function for HDTV receiver applications, for example. In particular, complications arise when the trellis decoder is required to provide seamless switching between multiple modes, such as may occur when switching between NTSC filtered and non-filtered input data or when switching between HDTV program channels, for example. In addition, cost and hardware constraints associated with consumer HDTV receivers require an efficient cost-effective trellis decoder design. Such a cost-effective design solution would employ an efficient trellis decoder architecture capable of accommodating interleaved datastreams and multiple modes of operation.

SUMMARY OF THE INVENTION

In accordance with the principles of the present invention, a trellis decoder system uses a feed-forward trellis demapping configuration to prevent error propagation. In a system for processing encoded binary data symbols representable as a symbol constellation, a decoder includes a delay for delaying received encoded symbol data. The decoder also includes a re-encoder for re-encoding decoded symbol representative data and a processor for deriving decoded symbol data. The processor derives decoded symbol data using the delayed encoded symbol data and re-encoded data representative of a difference between successive symbols computed using an error propagation-free, feed-forward configuration.

BRIEF DESCRIPTION OF THE DRAWINGS

In the drawing:

FIG. 2 shows a trellis encoder, pre-coder and symbol mapper as described in the HDTV Standard.

FIG. 3 is an encoder state table derived for the encoder system of FIG. 2.

FIG. 13 shows a flowchart for a process for performing a trellis traceback function used in the trellis decoding of interleaved data, according to the invention.

FIG. 14 shows a flowchart for a forward trace process used in the trellis decoding of interleaved data, according to the invention.

DETAILED DESCRIPTION OF THE DRAWINGS

Figure 1:
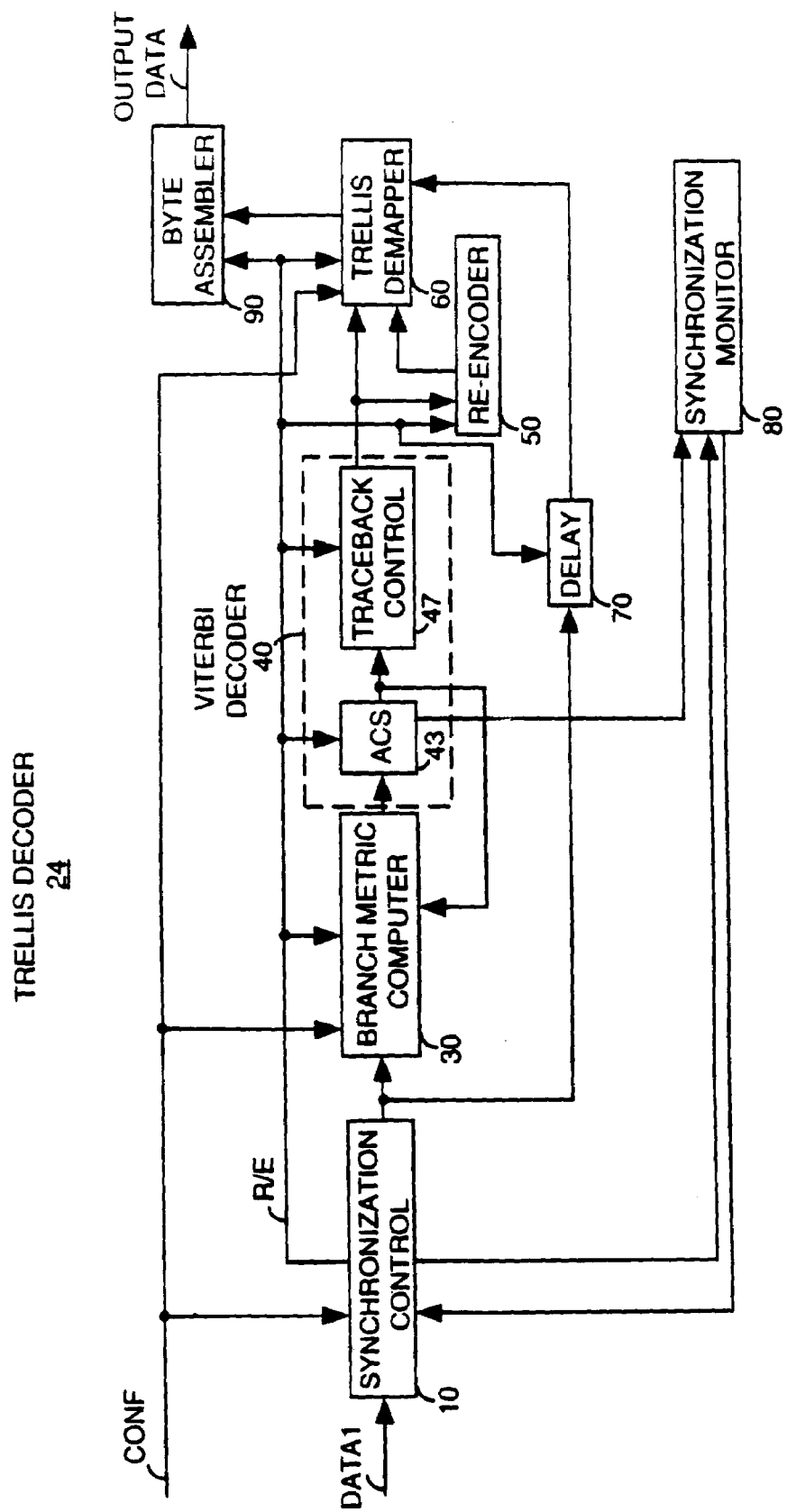
FIG. 1 shows a trellis decoder system according to the invention for decoding multiple interleaved datastreams and for providing seamless switching between multiple operating modes.

FIG. 1 shows a video receiver trellis decoder system 24, according to the invention, for decoding multiple interleaved datastreams such as data encoded according to the HDTV Standard, for example. The system adaptively decodes datastreams that are pre-processed into a plurality of formats (e.g. a normal 8-level format and a partial response 15-level format), and that are also pre-processed in one of a plurality of modes (filtered or non-filtered modes). The system also provides seamless Viterbi decoder switching between the filtered and non-filtered data modes. In addition, decoder 24 of FIG. 1 uses a single adaptive trellis decoder function rather than a plurality of parallel trellis decoders as portrayed in the HDTV Standard.

Although the disclosed system is described in the context of an HDTV receiver system, it is exemplary only. The disclosed system may be used in other types of communication systems. The system may also be used in other types of operating modes involving other types of pre-processing modes and functions, other types of filter functions and various data interleaving methods as well as other ways of enhancing signal noise immunity.

In overview, in FIG. 1, trellis encoded input data DATA1 from a demodulator (not shown) is input to synchronization control unit 10. DATA1 is in the form of a binary data sequence of data symbols as known where each symbol is represented by an assigned digital value. The set of symbols is represented in a complex plane as a set of points called a signal constellation, as known. Unit 10 detects Field and Segment synchronization signals within DATA1. A data Field comprises a plurality of segments, each of which contains a plurality of data packets. These synchronization signals are defined by the HDTV Standard in sections 10.2.3.9-10.2.3.13 and sections 4.2.6-4.2.7 (Annex D). Unit 10 uses these detected sync signals to re-align DATA1 and to provide output re-aligned data to branch metric computer (BMC) 30 and to delay unit 70. Synchronization control unit 10 also generates register reset and register enable signals, R/E, that are used to reset and synchronize decoder 24 of FIG. 1 at power-on, upon the occurrence of an out of sync condition, or in response to another input such as a global system reset, for example. Unit 10 also generates the R/E signals in response to an out-of-sync signal from synchronization monitor 80 as will be discussed later. In addition, an input signal CONF is used to configure FIG. 1 system elements to decode either filtered or non-filtered data. The CONF signal indicates whether or not DATA1 has been pre-filtered by an NTSC co-channel interference rejection filter. The CONF signal may be provided by a control processor (not shown to simplify the drawing) that communicates with the FIG. 1 elements for controlling the overall system functions, or it may be provided as a discrete signal from a source indicating filter presence, for example. The use of the rejection filter will be further discussed in connection with FIG. 12.

Branch metric computer 30 computes a set of values (metrics) for each received data symbol. The metrics represent the proximity of a received symbol to the other points in the set that comprise the symbol constellation. The computed metrics are output to code sequence detection system 40 which employs the known Viterbi decoding algorithm. The code sequence detection system, is described in the context of an exemplary Viterbi decoding system implemented using Add-Compare-Select (ACS) unit 43 and traceback control unit 47. ACS unit 43 performs a series of repetitive add-compare-select operations using the metrics from unit 30 to provide a sequence of decision bits to traceback control unit 47 and unit 30. The decision bits output by ACS unit 43 indicate the result of the add-compare-select operations on the metrics from unit 30. Traceback unit 47 uses the decision bits from unit 43 to determine for the received data symbols the most likely corresponding sequence of bits that would have been encoded by the encoder. In addition, an input decision bit from unit 43 is used in filtered mode to select between branch metric computation signal paths within the unit 30 architecture. Synchronization monitor 80 determines whether the re-aligned data output from unit 10 has been correctly synchronized by evaluating metric values from one of the add-compare-select computation units within ACS unit 43. Monitor 80 generates an out-of-sync signal for use by unit 10 and other receiver elements based on this metric value evaluation.

Traceback unit 47 outputs a sequence of trellis decoded decision bits to trellis demapper 60 and re-encoder 50. Unit 50 re-encodes the sequence of bits from unit 47 to provide a re-encoded bit sequence to demapper 60. In addition, re-aligned data from unit 10, delayed by unit 70, is provided to trellis demapper 60. Trellis demapper 60 uses the input data from units 47, 50 and 70 both to identify the transmitted data symbol, and to recover the corresponding original encoded data. The resulting recovered original data from demapper 60 is assembled into data bytes by assembler 90 and output to other receiver elements as required.

The detailed operation of the trellis decoder 24 of FIG. 1 will now be discussed. In this regard it is noted that Viterbi decoding, branch metric computation and trellis coding are known and generally described, for example, in the reference text *Digital Communication*, Lee and Messerschmidt (Kluwer Academic Press, Boston, Mass., USA, 1988).

The DATA1 input signal to trellis decoder 24 is encoded according to the HDTV Standard (section 4.2.5 of Annex D and other sections) using the encoding function depicted in FIG. 2. FIG. 2 shows that two input data bits X1 and X2 are encoded as three bits Z2, Z1 and Z0. Each three bit word corresponds to one of the 8 symbols of R. For this purpose X2 is processed by pre-coder 102, comprising filter components adder 100 and register 105, to provide encoded bit Z2, as known. X1 is encoded as two bits Z1 and Z0, as known, by trellis encoder 103 comprising adder 115 and registers 110 and 120. The output data words from the FIG. 2 encoder function are mapped into a sequence of data words or symbols, R, of decimal values as indicated by mapper 125 in FIG. 2. The operation of the encoder of FIG. 2 is illustrated by the accompanying state transition table of FIG. 3.

The data output R from the encoder of FIG. 2 represents a symbol constellation comprising 8 points or levels in 4 cosets. The coset values are: coset A=(A−, A+)=(−7, +1); coset B=(B−, B+)=(−5, +3); coset C=(C−, C+)=(−3, +5); and coset D=(D−, D+)=(−1, +7). This mapping is arbitrary. Other mappings, such as the 16 level mapping mentioned for cable operation in HDTV Standard section 5.1, may also be used. The data encoded in this form is modulated onto a carrier and transmitted to an HDTV receiver.

Figure 12:
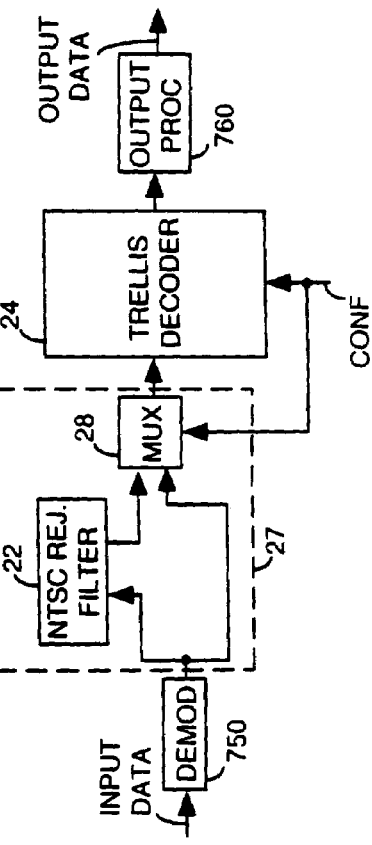
FIG. 12 shows a seamlessly switchable trellis decoder that adaptively decodes multiple interleaved datastreams of either filtered or non-filtered data, in the context of an HDTV receiver system.

In an HDTV receiver context as shown in FIG. 12, Vestigial Side Band (VSB) modulated encoded data is applied to input processor and demodulator unit 750 as will be discussed later. The demodulated data is pre-processed by a pre-processor 27 comprising NTSC co-channel interference rejection filter 22 and mux 28 before being trellis decoded. In pre-processor 27 of FIG. 12, either demodulated data from unit 750 or demodulated data from unit 750 filtered by NTSC rejection filter 22 is selected by mux 28 in response to the CONF signal. The selected data from mux 28 is decoded by trellis decoder 24. Data that is not pre-filtered by unit 22 prior to trellis decoding has a data format containing 8 encoded levels further modified by any noise or interference occurring in the communication process, as known. However, data that is pre-filtered by unit 22 prior to trellis decoding has a data format containing 15 encoded levels also modified by any noise or interference occurring in the communication process, as known.

In the filtered mode when rejection filter 22 is used, an eight state trellis decoder is required, and in the non-filtered mode when filter 22 is not used, a four state trellis decoder is required, as known. Trellis decoder system 24 (FIG. 1) advantageously incorporates a single eight state trellis architecture and seamlessly switches between modes. Decoder 24 provides seamless switching both for the optional filter modes and for data interruptions resulting from program changes and other types of transitions, for example. Trellis decoded data output by decoder 24 is intra-segment symbol deinterleaved by a deinterleaver (not shown). Symbol deinterleaved data from the deinterleaver is then further processed by output processor 760 before being passed to other HDTV receiver elements for processing and display, as will be discussed later.

The seamless switching capability of trellis decoder 24 results both from the decoder architecture and from the design of the individual decoder elements. A key feature of the architecture of decoder 24 is that it incorporates a single eight state ACS unit (unit 43) for both filtered and non-filtered data input modes. This permits Viterbi decoder 40 to transparently decode filtered or non-filtered data irrespective of the state of the CONF configuration signal. The inventors have recognized that an eight state ACS unit may be used to mimic the four state ACS architecture required for the non-filtered mode. This is because BMC unit 30 performs parallel equivalent computations to provide replicated branch metric values to ACS unit 43 in the non-filtered mode. The disclosed ACS structure not only emulates the desired four state ACS architecture when it is provided with the input replicated values, but also enables ACS unit 43 to operate the same way in filtered and non-filtered modes. Another feature of decoder 24 is that it incorporates an adaptive architecture responsive to input configuration signal CONF. The CONF signal indicates whether or not the decoder 24 input data is filtered by the NTSC rejection filter. These features permit decoder 24 to seamlessly operate between the filtered and non-filtered modes associated with the optional use of the NTSC filter.

Control unit 10 detects the HDTV Standard compatible Field and Segment synchronization signals in input DATA1. The Field and Segment sync signals are not trellis encoded or pre-coded. Therefore the sync signals may be detected using known techniques as discussed in HDTV Standard sections 10.2.3.9 and 10.3.2-10.3.3.3. These sync signals are used within unit 10 to buffer and re-align the data contained in DATA1 and to provide output re-aligned data segments, stripped of the sync information, to BMC unit 30 and to delay unit 70. The data is re-aligned by sequentially storing the data in buffer registers, or equivalent memory, followed by outputting the data from the registers with the non-data sync packets omitted. The non-data packets may be removed either prior to or after storage. The encoded re-aligned data output from unit 10 is in the form of successive segments. Each segment contains successive sequential packets of the 12 interleaved datastreams (SP1-SP12). Each packet contains one encoded data symbol as defined in the HDTV Standard. Neither the successive segments nor the successive packets contain intervening synchronization intervals. Alternative data re-alignment methods may be used. For example, instead of detecting and removing the sync intervals, decoder 24 may detect the sync intervals and disable or hold the decoder 24 functions in a known state using reset and register enable signals for the duration of the sync intervals.

Control unit 10 also generates Reset/Enable signals, R/E, that are used to reset and synchronize decoder 24. The R/E signals are generated at both power-on and in response to a signal from synchronization monitor 80 indicating an out-of-sync data condition. The R/E signals may also be generated in response to an external input signal such as a global system reset or program change indication signal, for example. The architecture of decoder 24 permits re-synchronizing the trellis decoding operation in response to the R/E signals. This re-synchronizing ability enables the single trellis decoding function of decoder 24 to provide seamless switching both for the optional filter modes and for data interruptions, i.e. switching that is unobjectionable to a viewer.

Control unit 10 also detects filtered data mode using the CONF signal and in this mode incorporates a further function to correct data corruption caused by the NTSC rejection filter. The data corruption occurs in the four symbol packets that occur twelve symbol intervals after the Segment sync. In filtered data mode, the co-channel rejection filter subtracts an encoded data symbol of the previous data segment from a collocated (i.e. the same relative symbol packet) encoded data symbol of the current data segment. This operation produces partial response input data (HDTV Standard sections 10.2.3.8 and 10.2.3.9). However, when a sync interval (four symbols in duration) precedes four symbol packets by twelve symbol intervals, the subtraction is corrupted. This is because sync values and not collocated symbol values are subtracted from these four symbol packets. Therefore unit 10, in filtered data mode, identifies the four symbol packets occurring twelve symbols after the segment sync interval. In addition, unit 10 adds back the stored sync values subtracted in the rejection filter and subtracts the stored correct symbol packet data (the four collocated symbol packets that precede the segment sync). In this manner, unit 10 provides a corrected partial response re-aligned data output to units 30 and 70 in filtered data mode. A similar method of correcting the partial response data is suggested in section 10.2.3.9 and FIG. 10.12 of the HDTV Standard.

Figure 6:
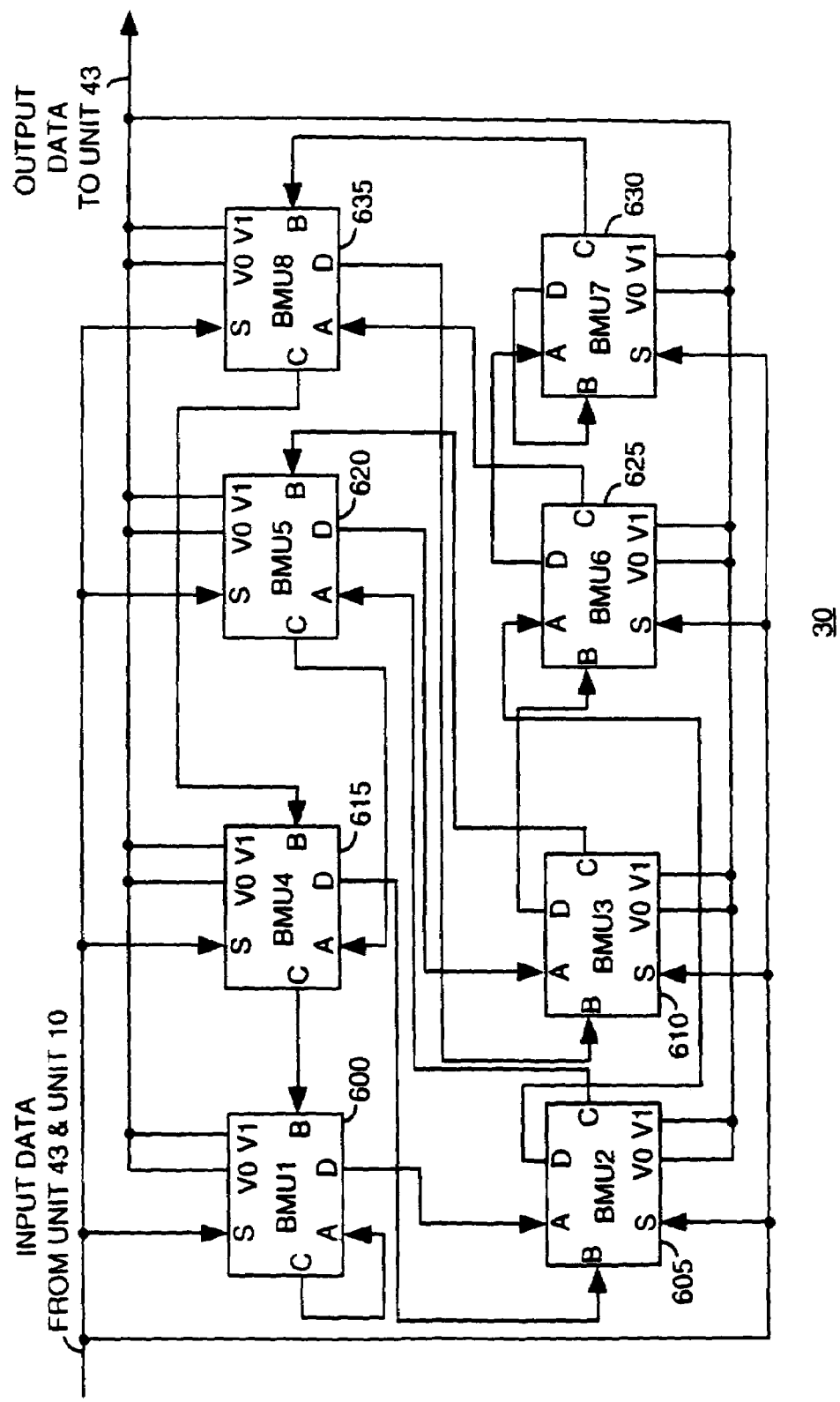
FIG. 6 is a block diagram showing a branch metric computer architecture suitable for use in the trellis decoder of FIG. 1.
Figure 7:
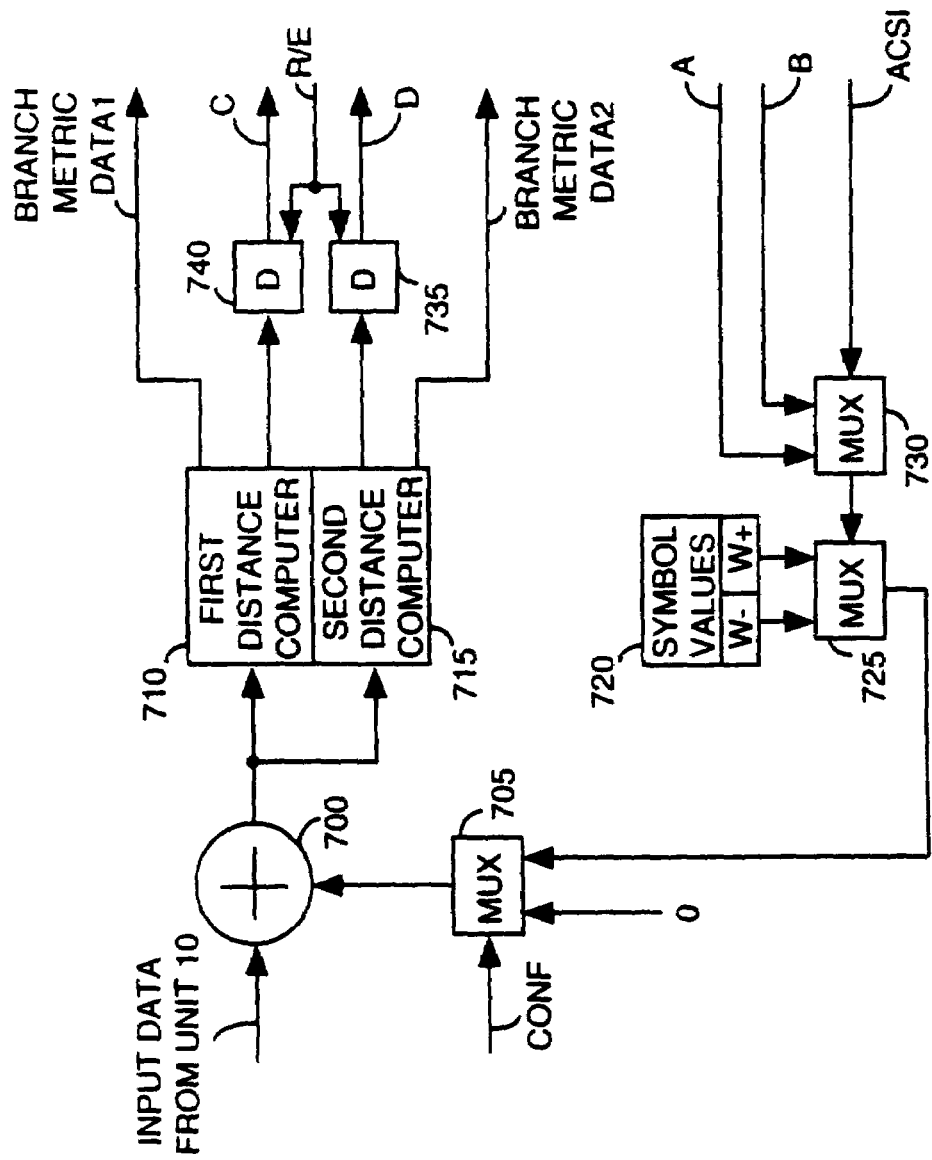
FIG. 7 is a diagram showing a branch metric computation unit architecture suitable for use in the branch metric computer architecture of FIG. 6.

Branch metric computer 30 computes values (metrics) for each encoded interleaved re-aligned symbol received from unit 10. The computed metrics are Viterbi decoded by unit 40 which incorporates Add-Compare-Select (ACS) unit 43 and traceback control unit 47. FIG. 6 shows the architecture of the branch metric computer (BMC) unit 30 of FIG. 1. FIG. 7 shows the architecture of an individual BMC unit of FIG. 6 and is representative of each of the BMU1-BMU8 units (units 600-635). The input data provided to the S inputs of units BMU1-BMU8 of FIG. 6 includes the interleaved symbol data from unit 10 and inputs from the ACS unit 43 (FIG. 1). The symbol data and ACS inputs (ACSI) are separately identified in FIG. 7 as inputs to units 700 and 730 respectively.

The BMC unit of FIG. 7 sequentially processes the encoded interleaved symbol sequence from unit 10. In a non-filtered data mode as selected by the CONF signal, input symbol data of a first interleaved symbol in the data from unit 10 is passed unaltered by adder 700. In this mode multiplexer (mux) 705 outputs a zero value to adder 700.

First and second distance computers 710 and 715 compute the Euclidean geometrical distance of the encoded input symbol from first and second cosets respectively and provide two corresponding metric value outputs, Branch Metric Data1 and Branch Metric Data2. Table I defines the coset computation performed by each BMU unit distance computer e.g. for BMU1 proximity to cosets A and C respectively are computed. Also, first and second distance computers 710 and 715 each provide, via registers 740 and 735, output bits C and D. Bits C and D indicate which one of the two values within each of the first and second cosets the input symbol is closest to. Registers 740 and 735 each comprise serially connected individual one bit registers through which bits C and D are cyclically shifted, respectively. In this manner output bits C and D for each of the 12 interleaved symbols from unit 10 (FIG. 1) are sequentially output from registers 740 and 735. The distance computer is typically implemented using look-up tables but may also be implemented by other methods such as by computing distances with subtraction, absolute value and comparison operations, for example.

TABLE I

| | COSET DEFINITION | | |
|---|---|---|---|
| BMU unit | First Distance Computer | Second Distance Computer | Coset W |
| BMU1 | A | C | A |
| BMU2 | B | D | C |
| BMU3 | B | D | A |
| BMU4 | A | C | C |
| BMU5 | C | A | B |
| BMU6 | D | B | D |
| BMU7 | D | B | B |
| BMU8 | C | A | D |

In the filtered data operating mode, input symbol data of a first interleaved symbol in the data from unit 10 is summed by adder 700 with either coset value W+ or coset value W− from unit 720 via muxes 725 and 705. The summed data is processed by distance computers 710 and 715 as explained before. Coset values W+ and W− belong to one of the four previously defined cosets A-D. The particular W+ and W− coset value which is used in an individual BMU unit is selected from the four defined cosets for that particular BMU unit as defined in Table I. The W+ and W− coset is chosen to restore the modified input symbol data from unit 10 to symbol data that can be processed by the distance computers 710 and 715. This operation is required in the filtered mode since the combination of interleaving and co-channel rejection filtering produces partial response input data as previously mentioned and not the normal symbol data produced in the non-filtered mode (HDTV Standard sections 10.2.3.8 and 10.2.3.9). Mux 730 via mux 725 determines whether W+ or W− is summed in adder 700 with the modified input data based on the state of the ACSI input decision bit from ACS unit 43 and the state of bit input signals A and B. The ACSI input decision bit from unit 43 determines whether input A or input B selects between the W+ and W− values that are summed by adder 700. For example, if ACSI=1, input B is selected by mux 730 and if B=1, W+ is selected by mux 725 to be added in adder 700 via mux 730. The A and B input interconnections are shown in FIG. 6, for example, A and B for unit BMU4 are provided by BMU5 and BMU6 respectively (FIG. 6). The remaining operation of the BMC unit of FIG. 7 in the filtered mode is the same as the operation described for the non-filtered mode.

BMC unit 30 of FIG. 1 similarly sequentially processes the remaining interleaved symbols of a re-aligned data segment from unit 10. After completely processing a re-aligned data segment, BMC unit 30 repeats the described process starting with the first interleaved data symbol packet of the next re-aligned data segment from unit 10.

The interconnection of the individual identical BMU units (BMU1-BMU8) is shown in the overall BMC architecture in FIG. 6. Interleaved symbol data from unit 10 is input to the S inputs of units BMU1-BMU8 and is processed by each of these interconnected units as described for the exemplary unit of FIG. 7. The resulting Branch Metric Data1 and Branch Metric Data2 outputs on terminals V0 and V1 of units BMU1-BMU8 are provided to ACS unit 43 (FIG. 1). ACS unit 43 of FIG. 1 performs a series of repetitive add-compare-select operations using the Branch Metric Data1 and Branch Metric Data2 outputs from each of the BMU units of unit 30.

Figure 4:
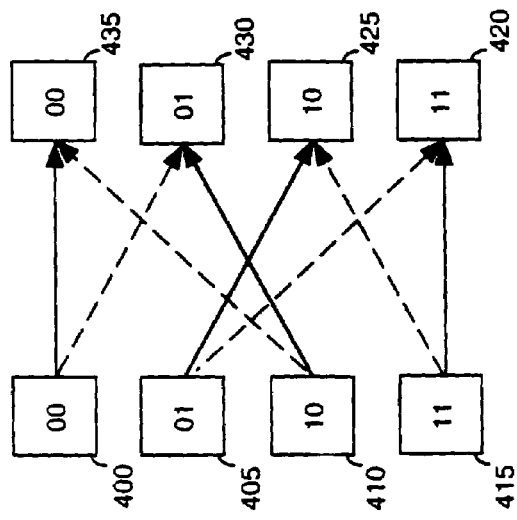
FIG. 4 is a four state trellis diagram derived for trellis decoding data that has not been pre-filtered by an NTSC co-channel rejection filter.
Figure 9:
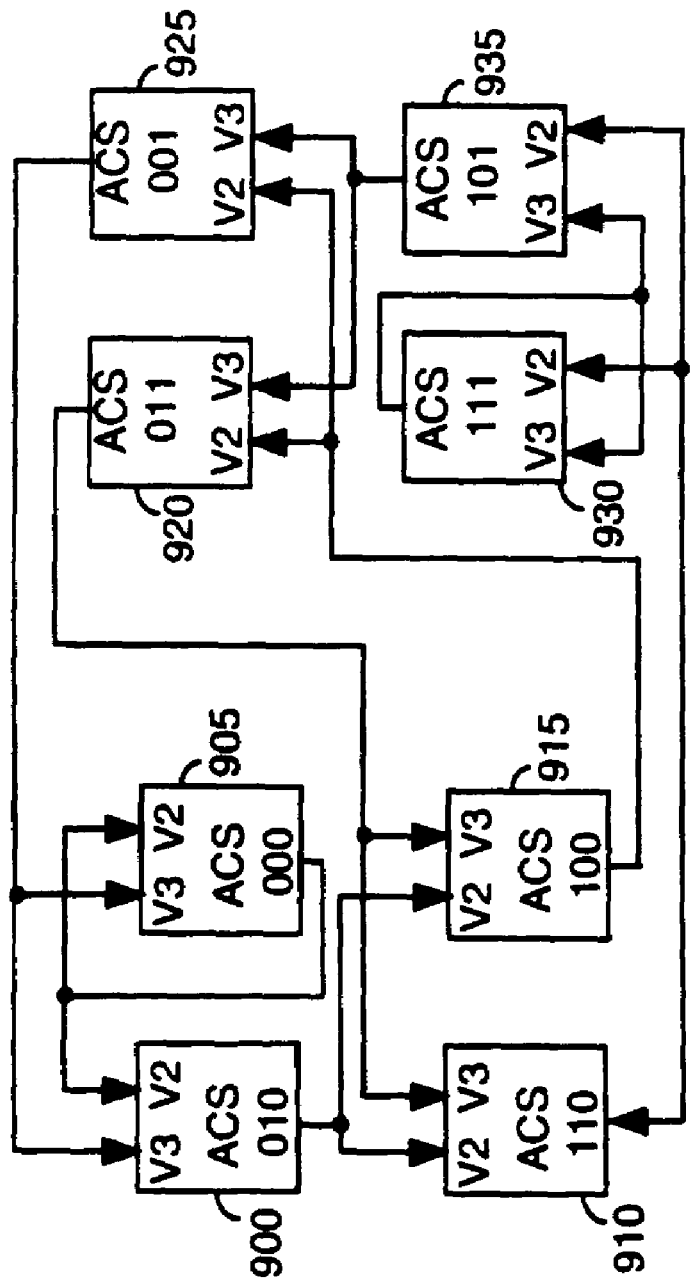
FIG. 9 is a diagram showing an ACS function architecture, according to the invention, suitable for use in the trellis decoder of FIG. 1.

FIG. 9 shows the interconnections between the individual ACS units that comprise the overall ACS architecture of unit 43 of FIG. 1. In FIG. 9 a single eight state ACS architecture is used for both filtered and non-filtered data input modes. The FIG. 9 ACS architecture implements the filtered mode eight state transition diagram of FIG. 5. Each ACS unit (units 900-935) is associated with a trellis state (000 . . . 111). The four state transition diagram of FIG. 4 shows the equivalent trellis state transitions for the non-filtered mode. Re-ordering of the states shown in the state transition diagram of FIG. 5 further clarifies the interconnections shown in FIG. 9.

Figure 8:
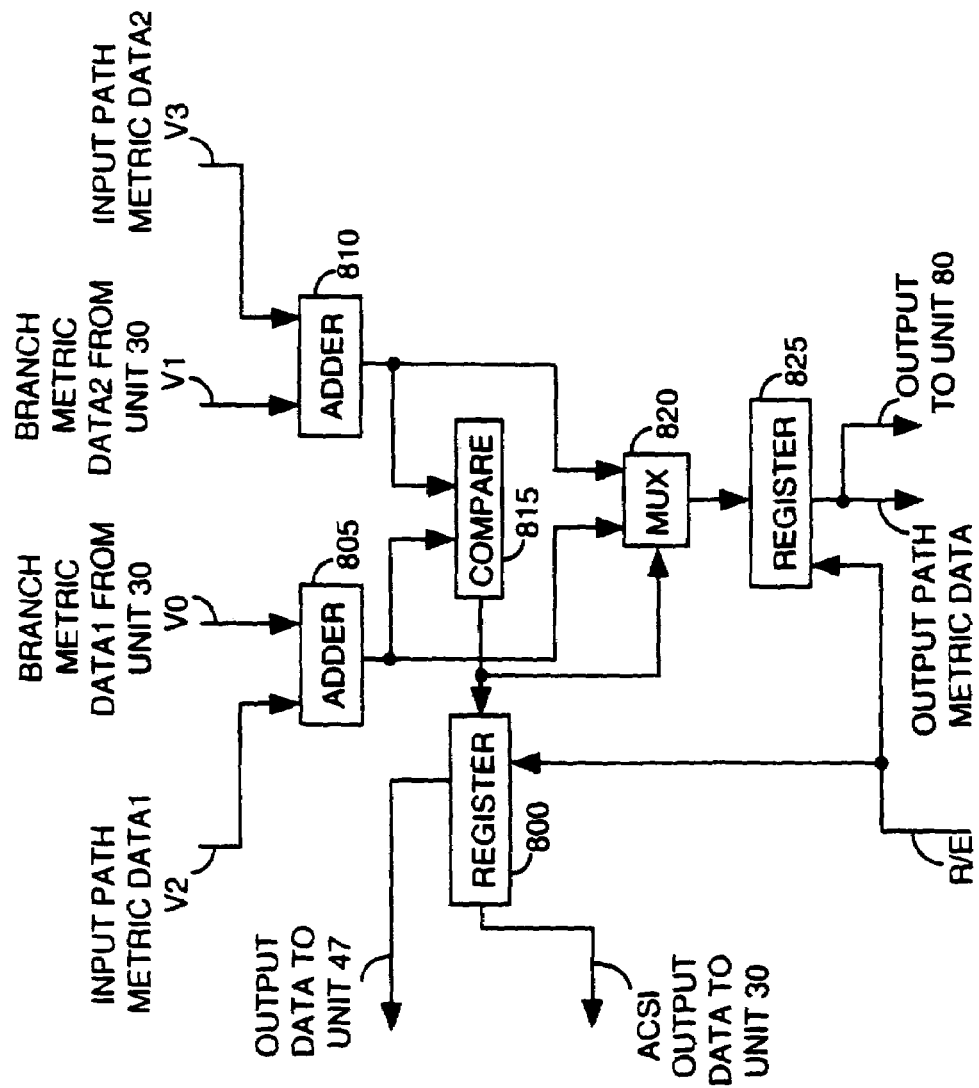
FIG. 8 is a diagram showing an architecture of an individual Add-Compare-Select (ACS) unit, according to the invention, suitable for use in the ACS function architecture of FIG. 9.

FIG. 8 shows the architecture of an individual ACS unit representative of each of the FIG. 9 ACS units (units 900-935). The FIG. 9 ACS architecture sequentially processes the branch metric data for the individual interleaved data symbols from unit 30 (FIG. 1). Adders 805 and 810 of FIG. 8 sum input Path Metric Data1 and input Path Metric Data2 obtained from other ACS units with the Branch Metric Data1 and Branch Metric Data2 outputs for an interleaved data symbol from BMU unit 30 (FIG. 1). The two resultant data sums from units 805 and 810 are compared by unit 815. A single decision bit output indicating which of the two sums is the smaller is output by unit 815 to register 800 and to mux 820. Mux 820 selects the smaller sum from the outputs of units 805 and 810. This selected sum appears as Output Path Metric Data at the output of register 825.

Register 800 comprises twelve serially connected individual one bit registers through which the decision bit output from unit 815 is cyclically shifted. The decision bit output provided as the ACSI output to unit 30 (FIG. 1) follows a twelve cycle delay by register 800. The decision bit output provided to traceback control unit 47 (FIG. 1) follows a single cycle delay by register 800. In this manner each single decision bit output associated with each of the 12 interleaved symbols is sequentially output from register 800. Similarly, register 825 comprises serially connected individual registers through which the Output Path Metric Data from unit 820 is cyclically shifted. In this manner the Output Path Metric Data associated with each of the 12 interleaved symbols is sequentially output from register 825. The bit width of the serially connected registers within unit 825 is selected in accordance with ACS unit processing resolution requirements.

The Output Path Metric Data from register 825 is provided to two other ACS units in accordance with the interconnection diagram of FIG. 9. For example, the Output Path Metric Data from ACS unit 900 of FIG. 9 is provided to the input Path Metric Data1, V2, inputs of ACS units 910 and 915. Similarly, input Path Metric Data1 and input Path Metric Data2 provided to adders 805 and 810 of FIG. 8 are provided by two other ACS units in accordance with the interconnection diagram of FIG. 9. For example, the Input Path Metric Data1, V2, input of ACS unit 900 is provided by ACS unit 905 and the input Path Metric Data2, V3, input of ACS unit 900 is provided by ACS unit 925. The sequence of decision bits indicating the result of the sequence of add-compare-select operations on the metrics from unit 30 (FIG. 1) are output from register 800 of FIG. 8 to traceback control unit 47 following a single cycle delay and to unit 30 (FIG. 1) following a twelve cycle delay. Each of the eight ACS units of unit 43 provides a sequence of decision bits to units 47 and 30. Eight decision bits are cyclically output in parallel from unit 43 to units 47 and 30 for each of the interleaved symbol packets provided by unit 10. BMC unit 30 and ACS unit 43 (FIG. 1) are interconnected as indicated in Table II. Units 30 and 43 are shown in FIGS. 6 and 9, respectively.

TABLE II

| OUTPUT | CONNECTED TO INPUT |
|---|---|
| BMU1-V0 | V0-ACS unit 905 |
| BMU1-V1 | V0-ACS unit 900 |
| BMU2-V0 | V0-ACS unit 915 |
| BMU2-V1 | V0-ACS unit 910 |
| BMU3-V0 | V1-ACS unit 915 |
| BMU3-V1 | V1-ACS unit 910 |
| BMU4-V0 | V1-ACS unit 905 |
| BMU4-V1 | V1-ACS unit 900 |
| BMU5-V0 | V0-ACS unit 925 |
| BMU5-V1 | V0-ACS unit 920 |
| BMU6-V0 | V0-ACS unit 935 |
| BMU6-V1 | V0-ACS unit 930 |
| BMU7-V0 | V1-ACS unit 935 |
| BMU7-V1 | V1-ACS unit 930 |
| BMU8-V0 | V1-ACS unit 925 |
| BMU8-V1 | V1-ACS unit 920 |
| ACSI unit 900 | BMU2-ACSI |
| ACSI unit 905 | BMU1-ACSI |
| ACSI unit 910 | BMU6-ACSI |
| ACSI unit 915 | BMU5-ACSI |
| ACSI unit 920 | BMU3-ACSI |
| ACSI unit 925 | BMU4-ACSI |
| ACSI unit 930 | BMU7-ACSI |
| ACSI unit 935 | BMU8-ACSI |

In the non-filtered mode, there are a maximum of four distinct branch metric values for a given received non-filtered symbol. Also, in this mode BMC unit 30 performs sixteen parallel computations to provide sixteen branch metric values to ACS unit 43, and a single computation is replicated four times. Therefore, the sixteen values provided to unit 43 include replications of the four distinct branch metric values. The replication of the branch metric values that are input to unit 43 enables the architecture of ACS unit 43 (FIG. 9) to emulate the desired four state ACS trellis of FIG. 4. Note, in practice, branch metric values are substantially, rather than perfectly, replicated by BMC unit 30 due to system noise.

Figure 5:
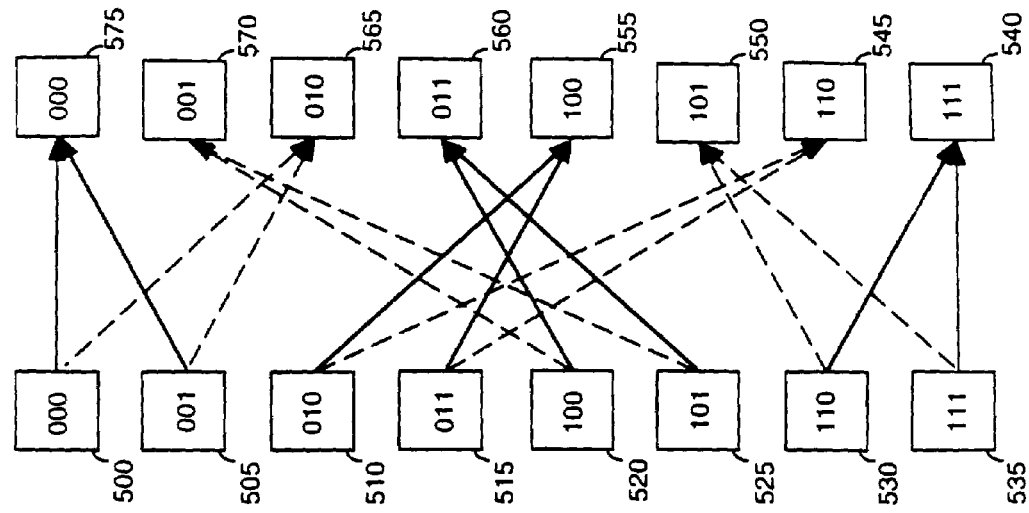
FIG. 5 is an eight state trellis diagram derived for trellis decoding data that has been pre-filtered by an NTSC rejection filter.

In the filtered mode, BMC unit 30 (FIG. 1) generates a maximum of fifteen distinct branch metric values for each input symbol and operates according to the eight state ACS trellis of FIG. 5. The use of a single eight state ACS architecture, as shown in FIG. 9, for both filtered and non-filtered input modes facilitates the seamless and transparent transition of trellis decoder 24 between the modes.

The Most Significant Bit (MSB) of the Output Path Metric Data from register 825 (FIG. 8) of one of the ACS units (units 900-935 of FIG. 9) is also provided to synchronization monitor 80 (FIG. 1). Synchronization monitor 80 counts the number of inversions in the MSB from register 825 that occur in a programmed time interval, and compares the count against a programmed threshold value. The programmed value may be provided by a control processor (not shown) or stored in unit 80. If the count exceeds the threshold value, an out-of-sync indication signal is generated and provided to Synchronization control unit 10 (FIG. 1). Upon receipt of an out-of-sync signal from unit 80, unit 10 provides a reset signal to unit 80 to reset the synchronization monitor to permit detection of another out-of-sync condition. Monitor 80 may be alternatively arranged to respond to different parameters.

The architecture of ACS unit 43 provides decision bit data to traceback unit 47 (FIG. 1) organized both by interleaved data symbol and by ACS unit trellis state. Traceback unit 47 cyclically receives eight decision bits in parallel (B1-B8, one 8 bit word) from the corresponding eight ACS units of unit 43 for each of the encoded interleaved symbols provided by unit 10. One eight bit word is cyclically received per interleaved symbol. The received decision words represent eight sequences of decision bits from the corresponding eight ACS units of unit 43. Unit 47 sequentially processes each decision word from unit 43 associated with an individual interleaved data symbol. Decision words are used by unit 47 to produce the most likely sequence of Z1 bits representing the interleaved symbol sequence previously encoded at the transmitter. Each decision bit identifies which of the two possible state transition paths lead to an ACS unit state.

Figure 10:
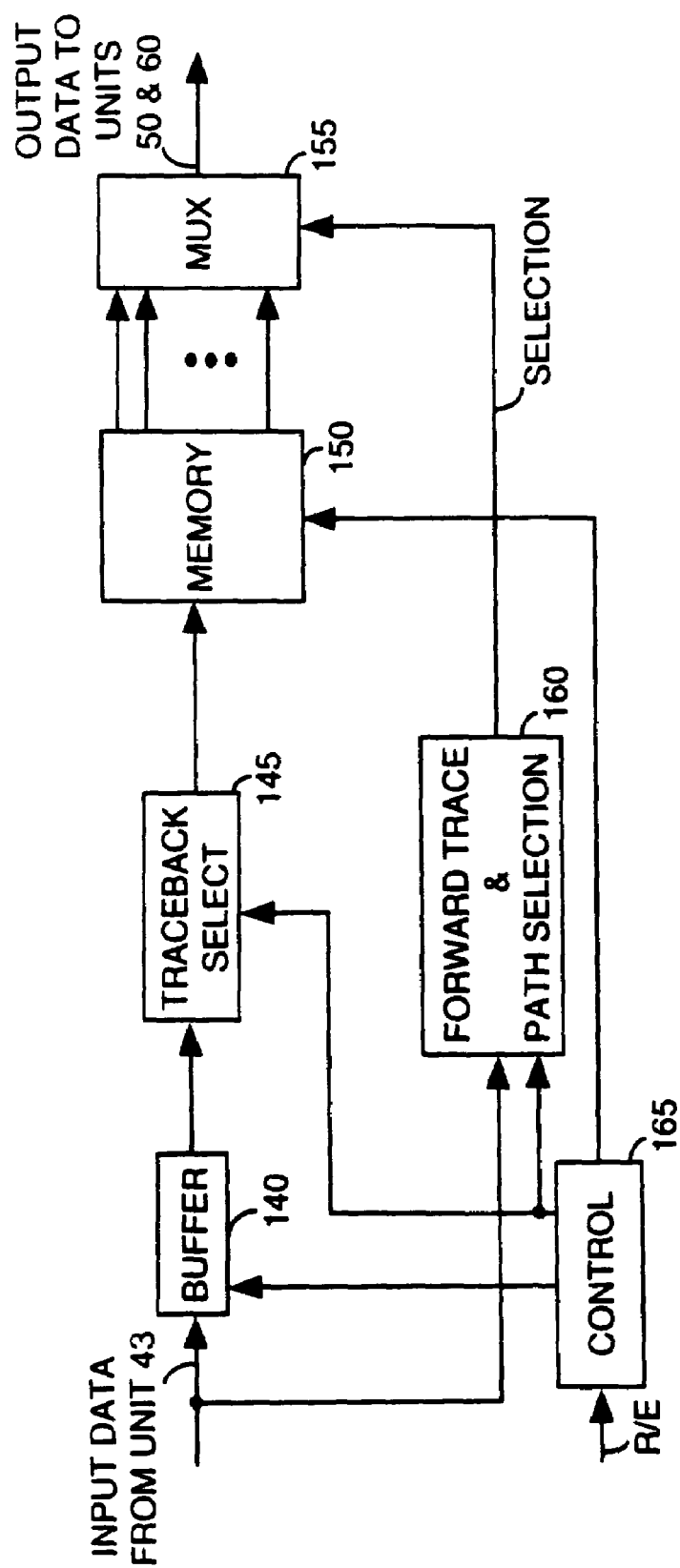
FIG. 10 is a diagram showing a traceback control unit architecture, according to the invention, suitable for use in the trellis decoder of FIG. 1.

FIG. 10 shows the architecture of Traceback Control unit 47 (FIG. 1). The operation of traceback unit 47 will be described for decision words associated with a sequence of encoded interleaved symbols output by ACS unit 43. The traceback architecture of FIG. 10 implements the trellis decoding process depicted in FIG. 15. In step 443 of FIG. 15, following the start at step 440, decision words are cyclically input in the form of eight decision bit sequences from ACS unit 43 (FIG. 1). The input decision words are provided to forward trace unit 160 (FIG. 10) and, in step 445, are also stored and delayed in buffer memory 140 (FIG. 10). In step 450, traceback select unit 145 of FIG. 10 derives eight trellis decoded bit sequences from the decision bit sequences stored in unit 140. These trellis decoded bit sequences are candidates for the most likely encoded Z1 bit sequence corresponding to the encoded interleaved data symbols.

Figure 15:
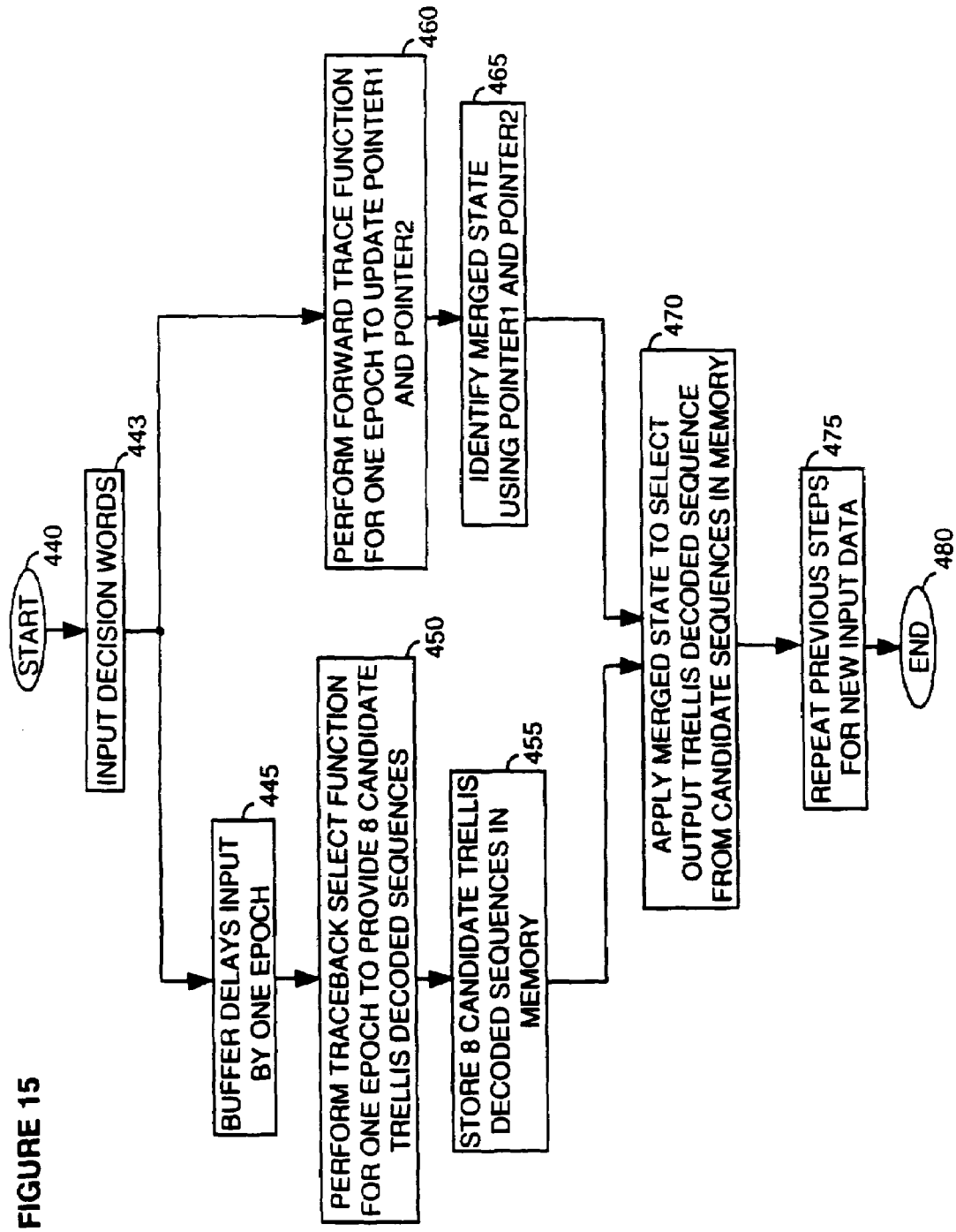
FIG. 15 shows a trellis decoding process, incorporating the FIG. 13 and FIG. 14 processes, that implements the FIG. 10 traceback control function, according to the invention.

In step 450 of FIG. 15, unit 145 (FIG. 10) derives the candidate decoded Z1 bit sequences by determining state transition trellis paths in a traceback process. In this process, an initial antecedent trellis state is identified for the current state of one of the eight decision bit input sequences. This initial state is identified by using a decision bit from ACS unit 43 (FIG. 1) in the input sequence as an indicator of an antecedent transition path. From this initial antecedent state, other antecedent states are identified by traversing the trellis state transition diagram in reverse direction using the decision bits from ACS unit 43 until a sequence of antecedent states has been identified. From this sequence of antecedent states a corresponding sequence of trellis decoded bits is determined. These steps are repeated for each of the remaining sequences of decision bits stored in buffer 140 (FIG. 10). The theory behind the traceback process is known and is described with other different traceback methods in *Architectural Tradeoffs for Survivor Sequence Memory Management in Viterbi Decoders* by G. Feygin et al published in the I.E.E.E. Transactions on Communications, vol. 41, No. 3, March 1993.

The described traceback process is performed to a predetermined depth T, the traceback depth, to identify a predetermined number of antecedent states. In accordance with known theory, traceback interval T is adopted in practice as a sufficient interval of traceback to identify a merged or converged state (Lee and Messerschmidt, section 7.4.3). The merged state is the state that is likely to be reached following traceback from any initial antecedent trellis state. The merged state identifies the data sequence with the greatest likelihood of being the true encoded Z1 data. Therefore, the merged state indicates the trellis decoded data sequence that is to be output from the candidate sequences. The traceback process, in the exemplary embodiment, is performed in two stages for traceback intervals, termed Epochs, equal to $$\frac{T}{2}.$$

The selection of such Epochs or sub-traceback intervals is arbitrary and selectable by a system designer.

In order to identify the candidate decoded trellis sequences, traceback is performed on collocated interleaved symbol packets of successive re-aligned data segments. Traceback on one of the twelve interleaved symbol packets, for example packet seven (SP7), is performed to identify antecedent states for symbol data in the corresponding prior, here seventh (SP7), interleaved symbol packets.

Although traceback on a single trellis path is known, the disclosed system advantageously extends the traceback process to encompass traceback for interleaved data and for a plurality of candidate decision bit sequences. This extended traceback process is performed on an Epoch by Epoch basis using the method of FIG. 13 which is implemented by unit 145 of FIG. 10. In step 645 of FIG. 13, following the start at step 640, internal storage registers within traceback select unit 145 are initialized at an Epoch data boundary in response to control signals from control unit 165 (FIG. 10). A decision word for an interleaved symbol packet, e.g. SP1, is cyclically input at step 650 from buffer 140 (FIG. 10). An antecedent state is identified from the current state in step 655 by applying the previously described traceback process using a decision bit, e.g. B1, of the decision word input in step 650. A key feature of the process is that the antecedent state is identified for symbol data of collocated interleaved packets of successive data segments. For example, for the seventh interleaved symbol packet (SP7) of a data segment, a corresponding seventh interleaved symbol packet decision bit is used to identify an antecedent state. In step 655 a trellis decoded bit corresponding to the identified antecedent state of the interleaved symbol is stored in memory 150 by unit 145 (FIG. 10).

Step 660 repeats step 655 for each of the remaining decision bits (B2-B8 in the example) of the input decision word until eight trellis decoded bits for the interleaved symbol have been stored in memory 150 (FIG. 10). In step 665, steps 650-660 are repeated for each of the remaining twelve interleaved symbols (SP2-SP12 in the example) of a re-aligned data segment. Similarly, steps 650-665 are repeated in step 670 for the number of re-aligned data segments that comprise an Epoch interval. In step 675, the resulting eight candidate trellis decoded bit sequences for the input interleaved symbols are provided by unit 145 to memory 150 of FIG. 10. This iteration of the traceback process for one Epoch interval ends at step 680 of FIG. 13 and completes step 450 of the encompassing process of FIG. 15.

In steps 460 and 465 of FIG. 15, forward trace unit 160 (FIG. 10) identifies the trellis decoded bit sequence in the eight candidate sequences that most likely corresponds to the sequence that was encoded and transmitted to the receiver. In step 470, the resulting identified trellis decoded sequence, following a delay, is provided by memory 150 to trellis demapper 60 and re-encoder 50 (FIG. 1) via mux 155 in response to a selection signal from trace unit 160.

In steps 460 and 465 of FIG. 15, trace unit 160 identifies the merged state and the trellis decoded bit sequence that most likely corresponds with the transmitted interleaved symbol packet sequence. Trace unit 160 identifies the trellis decoded bit sequence on an Epoch by Epoch basis using the forward trace process shown in FIG. 14. The forward trace technique is a cost-effective method of reducing data decoding delay (latency).

In step 460 of FIG. 15, the FIG. 14 forward trace process is performed for an Epoch interval of input data to update two pointers, pointer1 and pointer2, for each of the eight data sequences. These pointers are used to identify the trellis decoded bit sequence.

In step 843 of FIG. 14, following the start at step 840, the eight pointer2 indicators are updated with corresponding pointer1 indicator values. These pointers are stored within unit 160. In step 845, internal storage registers within unit 160 are initialized at an Epoch data boundary in response to control signals from control unit 165 (FIG. 10). Control unit 165 provides control signals in response to the R/E input signals from unit 10 (FIG. 1) for synchronizing both trace units 145 and 160 to start tracing at an Epoch boundary. A non-delayed decision word for an interleaved symbol packet, e.g. SP1, is cyclically input at step 850 from ACS unit 43 (FIG. 1).

In step 855, a three stage procedure is used to update one of eight separate pointer1 indicators that are associated with the eight data sequences of the input decision words. A decision bit, e.g. B1, of the input non-delayed word is used to identify an antecedent state from the current state by applying the previously described traceback process. The antecedent state is identified for symbol packet data of a collocated interleaved symbol packet (SP1 in the example) of a preceding data segment as described for the traceback process of unit 145. The identified antecedent state is used to select one of the eight separate pointer1 indicators that are associated with the eight data sequences of the input decision words. The state indicated by the selected pointer1 of the interleaved symbol (SP1 of the example) is stored in the pointer1 indicator associated with the decision bit sequence (the sequence for B1 in the example) overwriting any previous pointer1 contents.

Step 860 repeats step 855 for each of the remaining decision bits of the input decision word (bits B2-B8 of the example) until separate pointer1 indicators for each of the eight data sequences are stored in unit 160 for the interleaved symbol (SP1). In step 865, steps 850-860 are repeated for the remaining interleaved symbols (symbols SP2-SP12 in the example) of a twelve symbol re-aligned data segment. Similarly, step 870 repeats steps 850-865 until the number of re-aligned data segments that comprise an Epoch interval $$\left(\frac{T}{2}\right)$$

have been processed. This iteration of the forward trace process ends at step 880 of FIG. 14 and completes step 460 of the encompassing process of FIG. 15.

In step 465 of FIG. 15, the updated pointers, pointer1 and pointer2, are used to identify the merged state. Following a traceback interval T, in steady state operation, both pointer1 and pointer2 for a particular data sequence, indicate the antecedent state occurring one Epoch ago. Pointer1 is the current Epoch pointer and pointer2 is the immediately prior Epoch pointer. Together, pointer1 and pointer2 point back one traceback interval T to a converged or merged antecedent state. Pointer1 and pointer2 for all eight data sequences should, in the absence of error, indicate the same merged state and hence identify the same data sequence for release from memory 150. One of the pointer1 indicators for the eight data sequences is selected and used to identify one of the eight pointer2 indicators. In turn, this identified pointer2 indicator is used to identify the merged state. Therefore, one of the eight pointer1 indicators in conjunction with one of the eight pointer2 indicators are used for identification. However, it is also possible that the pointers may be averaged or chosen on a majority or other basis to improve confidence in the merged state selection.

The merged state determined in step 465 is used in step 470 to indicate which one of the eight candidate trellis decoded bit sequences is to be released from memory 150 via mux 155 (FIG. 10). The selected decoded data sequence is the data that most likely corresponds with the transmitted encoded interleaved symbol sequence.

The resulting identified trellis decoded sequence, following a delay, is released by memory 150 to trellis demapper 60 and re-encoder 50 (FIG. 1) via mux 155 (FIG. 10) in response to a selection signal from trace unit 160. The released trellis decoded sequence output from mux 155 to trellis demapper 60 and re-encoder 50 (FIG. 1) reproduces the original sequence of X1 bits of the interleaved symbols that were encoded by the encoder of FIG. 2. Note, the X1 bit sequence is equal to the Z1 bit sequence as shown in FIG. 2. The steps of the FIG. 15 process are repeated as long as there is available input decision data. The process otherwise terminates at step 480.

Figure 11:
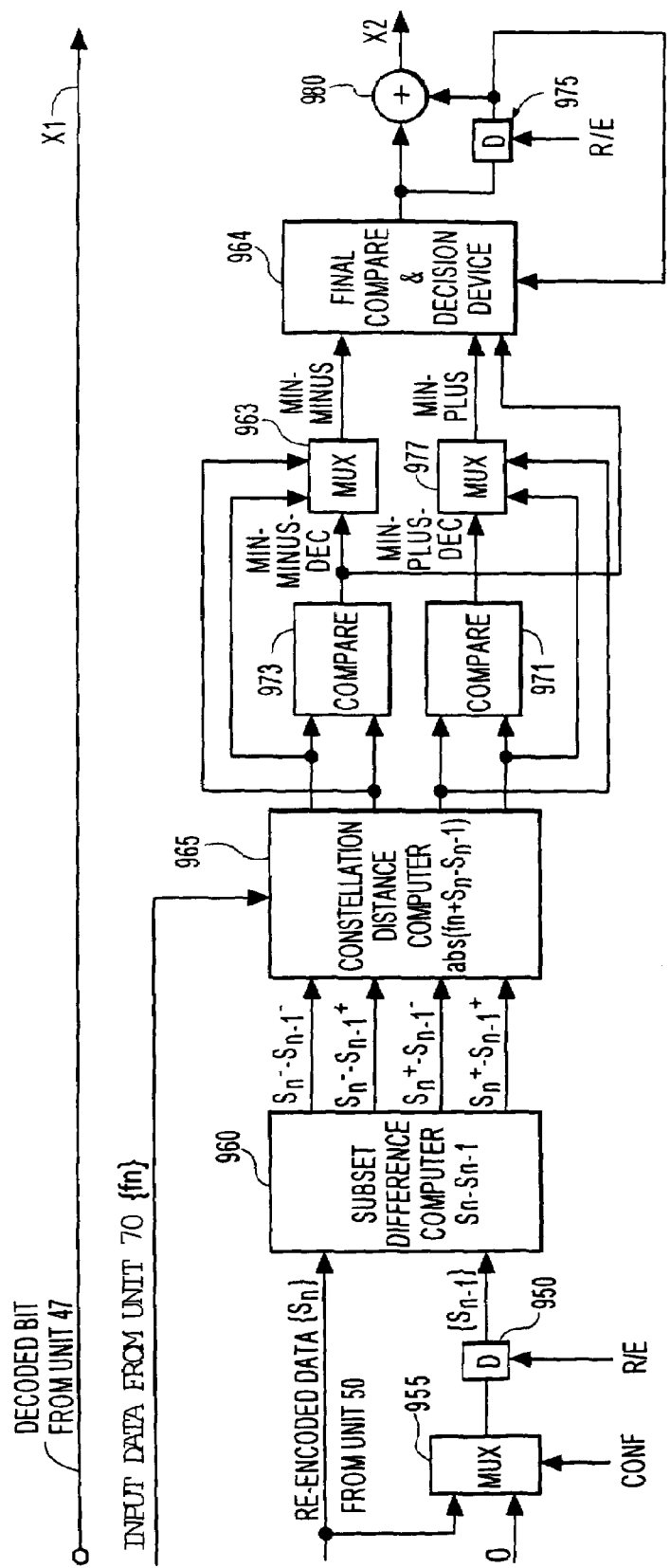
FIG. 11 is a diagram showing a trellis demapper architecture incorporating feed-forward mapping according to the invention principles for use in the trellis decoder of FIG. 1.

Unit 50 (FIG. 1) sequentially re-encodes the interleaved Z1 sequence of bits from unit 47 (and mux 155 of FIG. 10) to provide a re-encoded Z0 bit sequence to demapper 60. The re-encoding function used to produce Z0 from Z1 duplicates the equivalent function performed in the encoder prior to transmission as depicted in FIG. 2. In addition, re-aligned interleaved symbol data from unit 10, delayed and synchronized to the output of unit 47 by unit 70, is provided to trellis demapper 60. FIG. 11 shows the architecture of trellis demapper 60 (FIG. 1). Trellis demapper 60 sequentially processes the synchronized interleaved data sequences from units 47, 50 and 70 (FIG. 1).

In describing and interpreting FIG. 11, the following convention is adopted. The data representing the 8 point symbol constellation described in connection with FIG. 2 and comprising the 4 cosets, coset A=(A-, A+); coset B=(B-, B+); coset C=(C-, C+); and coset D=(D-, D+) are represented in the time domain in the form of subset values $S_n$, $S_{n-1}$, and $S_{n+1}$, where n is a time index. These subset values represent coordinate pair values, specifically, $S_n=(S_n^-, S_n^+)$ for a current symbol time period n, $S_{n-1}=(S_{n-1}^-, S_{n-1}^+)$ for the immediately prior symbol time period n−1, and $S_{n+1}=(S_{n+1}^-, S_{n+1}^+)$ for the immediately succeeding symbol time period n+1.

Demapper 60 uses units 950-980 to decode information bits of the symbol coordinate representative subsets using a state machine that advantageously uses past subset outputs instead of decoded bits themselves. This avoids a problem of error propagation involved in the feedback of past subsets and/or past decoded bits.

In a conventional trellis demapper, re-encoded data (e.g. from unit 50) together with delayed received data (e.g. from unit 70) is used to determine the output bit X2. The inventors have recognized that in such a conventional demapper (and in other decoding applications) catastrophic error propagation may result from cumulative error feedback. This occurs under a variety of conditions including, for example, in filtered data mode when NTSC co-channel interference rejection filter (unit 22 of FIG. 12) is active. Demapper 60 of FIG. 11 advantageously avoids such catastrophic error propagation by employing a feed-forward technique involving the feed-forward of prior state or decoded outputs rather than the feedback of intermediate state or decoded data. This technique is applicable to any partial response or other decoding system involving error determination and time domain decision making for deriving the best possibility from multiple candidate possibilities.

In FIG. 11, re-encoded data representing two possible constellation points in the form of current subset values, $S_n$, is provided by re-encoder 50 to subset difference computer 960. In addition, re-encoded data from unit 50 is delayed by 1 symbol period by unit 950 via multiplexer 955 in order to generate delayed subset values $S_{n-1}$ which are also provided to computer 960. In non-filtered data mode, the previous subset values $S_{n-1}$ provided to computer 960 are set to zero via multiplexer 955 and delay 950 in response to the CONF signal. Unit 960 computes the four types of differences between the coordinate pairs of subsets $S_n$ and $S_{n-1}$ i.e. unit 960 computes, $(S_n^- - S_{n-1}^-)$, $(S_n^- - S_{n-1}^+)$, $(S_n^+ - S_{n-1}^-)$, $(S_n^+ - S_{n-1}^+)$. These four computed outputs are provided by computer 960 to constellation distance computer 965 which computes the absolute distance of each computed subset difference from the corresponding delayed data input $f_n$ from unit 70. The four computed subset differences from unit 965 are processed by comparators 973, 971 and 964 in conjunction with multiplexers 963 and 977 in order to identify the smallest subset difference from the delayed data $f_n$. For this purpose, comparators 973 and 971 respectively provide min_minus and min_plus intermediate constellation distance difference values via multiplexers 963 and 977 to final comparator 964.

Demapper 60 derives a resultant output X2 bit value by different methods depending on whether or not unit 965 provides a single computed subset difference as a minimum value indicating that there is no decision ambiguity. This is the most likely case and occurs when only one of the four signals output by unit 965 comprises a minimum distance value. In this case, unit 964 declares the current demapped bit as the demapped output bit X2p. For this purpose, unit 964 determines the smaller of the min_minus input from unit 963 and the min_plus input from unit 977. If the min_minus input is the smallest, the demapped bit X2p is set to zero. If the min_plus input is the smallest, the demapped bit X2p is set to 1. This bit output convention is determined to provide conformity with the original signal mapping as previously described in connection with FIGS. 2 and 3. Consequently, X2p is advantageously derived using feed-forward of past subset outputs instead of feedback of decoded bits or subset outputs thereby avoiding cumulative error propagation.

In the case that more than one of the four signal output values from unit 965 are equal and comprise the minimum distance value, a decision ambiguity occurs. In this case, the previous output of unit 964 (i.e. the output of unit 964 delayed by the delay element 975) is compared by unit 964 with the min_minus_dec signal output by comparator 973. If these two outputs are the same, the demapped bit X2p is set to zero, otherwise bit X2p is set to one. In other embodiments, the min_plus_dec signal output by comparator 971 may alternatively be used for this purpose. It is to be noted that, although a delayed decision bit is being fed back from unit 975 to unit 964 to resolve the decision ambiguity, this does not result in error propagation. This is because a previous decoded output is only used to produce a future output in the case of equality between computed subset differences produced by unit 965. Once this equality is resolved, unit 965, in normal operation, produces a unique value as the minimum distance value in the next cycle thereby preventing repetitive feedback of decoded outputs and eliminating feedback mechanism induced error propagation. The final demapped output bit X2 is produced by unit 980 exclusively-ORing X2p (the current output of unit 964) with the previous output of 964 produced by unit 975.

Demapper 60 (FIG. 1) provides the resulting recovered X2 data together with synchronized X1 data to assembler 90. An X1 bit and an X2 bit corresponding to each interleaved data symbol that is input to decoder 24 are sequentially provided by unit 60 to assembler 90. Each X1, X2 bit pair is the trellis decoded data for a symbol packet. Assembler 90 assembles four X1, X2 bit pairs for collocated interleaved packets of successive data segments into one eight bit byte. Unit 90 assembles data bytes in this way for each of the twelve interleaved symbol packets. Unit 90 outputs the bytes on a byte by byte basis for each of the twelve interleaved symbol packet streams. In this manner unit 90 provides intra-segment symbol deinterleaved output data for use by remaining receiver elements.

In an exemplary HDTV receiver system shown in part in FIG. 12, encoded data is processed and demodulated by processor and demodulator 750. Unit 750 includes an input channel tuner, RF amplifiers, an IF (Intermediate Frequency) amplifier and mixer stage, for down converting the modulated signal to a lower frequency band suitable for further processing. Input processor 750 also includes an automatic gain control network, analog to digital converter, and timing and carrier recovery networks. The received signal is demodulated to baseband by the carrier recovery network within unit 750. The carrier recovery network may employ equalizer, rotator, slicer and phase error detector networks as well as a phase controller for controlling the equalizer and rotator operation, as known.

Either the demodulated data or the demodulated data processed by NTSC rejection filter 22 is selected by mux 28 in response to the CONF signal and decoded by decoder 24, according to the invention. Trellis decoded and intra-segment symbol deinterleaved data output by decoder 24 is provided to unit 760. Symbol deinterleaved data from decoder 24 is convolutionally inter-segment deinterleaved and Reed-Solomon decoded by output processor 760 before being passed to other HDTV receiver elements for further processing and display. The intra-segment deinterleaving process associated with trellis coding is distinct and different from the inter-segment deinterleaving process (HDTV Standard sections 10.2.3.9 and 10.2.3.10). The functions discussed in connection with units 750 and 760 are described, for example in the Lee and Messerschmidt text previously mentioned, among others.

The architectures discussed with respect to FIGS. 1-15 are not exclusive. Other architectures may be derived in accordance with the principles of the invention to accomplish the same objectives. For example, either a single trellis decoder may be used to decode N packets of input data, or more than one trellis decoder may be used (e.g. less than N) depending on the requirements of a particular system. In addition, architecture may be devised with different numbers of trellis transition states. The principles of the invention are not restricted to the described eight state architecture. Further, the functions of the elements of the various architectures may be implemented in whole or in part within the programmed instructions of a microprocessor.

What is claimed is:

1. A method for use in a decoder, the method comprising the steps of:
   delaying received encoded symbol data to produce delayed data;
   re-encoding decoded symbol representative data to produce re-encoded symbol data;
   feed-forward processing said re-encoded symbol data to produce difference data representative of a difference between successive symbols of said re-encoded symbol data; and
   deriving decoded symbol data using said delayed data and said difference data.

2. A method according to claim 1, wherein
   said feed-forward processing is exclusive of feed-back processing.

3. A method according to claim 1, wherein
   said feed-forward processing prevents error accumulation induced by error-propagation resulting from feed-back processing.

4. A method according to claim 1, including the steps of
   comparing candidate values, each candidate value representative of distance between said delayed data and said difference data, to determine a minimum distance value, and
   if more than one candidate value has the same determined minimum distance value, resolving this equality in response to a prior delayed and fed back comparison representative output.

5. A decoder comprising:
   a delay element for delaying received encoded symbol data to produce delayed data;
   a re-encoder for re-encoding decoded symbol representative data to produce re-encoded symbol data; and
   a processor for,
      feed-forward processing said re-encoded symbol data to produce difference data representative of a difference between successive symbols of said re-encoded symbol data; and
      deriving decoded symbol data using said delayed data and said difference data.

6. A decoder according to claim 5, wherein
   said feed-forward processing is exclusive of feed-back processing.

7. A decoder according to claim 5, wherein
   said feed-forward processing prevents error accumulation induced by error-propagation resulting from feed-back processing.

8. A decoder according to claim 5, wherein
said processor includes a decision processor for deriving said decoded symbol data by computing an absolute distance between said difference data and a corresponding delayed received encoded symbol of said delayed data.

9. A decoder according to claim 5, wherein said processor includes,
a decision processor for deriving said decoded symbol data by computing absolute distances using said difference data and said delayed data, and
a comparator for comparing the computed absolute distances to determine a minimum symbol difference value.

10. A decoder according to claim 5, wherein said processor includes,
a decision processor for comparing candidate values, each candidate value representative of distance between said delayed data and said difference data, to determine a minimum distance value and, if more than one candidate value has the same determined minimum distance value, resolving this equality in response to a prior delayed and fed back comparison representative output.

11. A decoder according to claim 10, wherein
said prior delayed and fed back comparison representative output is only used in the case of equality.

12. A decoder according to claim 5, wherein
said processor derives decoded symbol data in a partial response system.

13. A decoder comprising:
a delay element for delaying received encoded symbol data to produce delayed data;
a re-encoder for re-encoding decoded symbol representative data to produce re-encoded symbol data; and
a processor for demapping including,
    a feed-forward processor for processing said re-encoded symbol data exclusively of feed-back processing in order to produce difference data representative of a difference between successive symbols of said re-encoded symbol data; and
    a decision processor for deriving said decoded symbol data by computing an absolute distance using said difference data and said delayed data.

14. A decoder according to claim 13, wherein said processor for demapping includes,
a comparator for comparing computed absolute distances to determine a minimum symbol difference value.

15. A decoder according to claim 13, wherein said processor for demapping includes,
a comparator for comparing candidate values representative of distance between said delayed data and said difference data to determine a minimum distance value and, if more than one candidate value has the same determined minimum distance value, resolving this equality in response to a prior delayed and fed back comparison representative output.

16. A decoder according to claim 15, wherein said processor for demapping uses a different configuration in resolving equality than is used for deriving said difference data.

17. A trellis decoding apparatus comprising:
a delay element for delaying received trellis encoded data to produce delayed data;
a re-encoder for re-encoding decoded trellis encoded data using decision data associated with trellis state transitions in response to said trellis encoded data to produce re-encoded subset data;
a processor for,
    feed-forward processing said re-encoded subset data to produce subset difference data representative of a difference between successive symbols using past subset outputs in an error propagation-free, feed-forward configuration; and
    deriving decoded symbol data using said delayed data and said difference data.

18. A trellis decoding apparatus according to claim 17, wherein
said error propagation-free feed-forward configuration of said processor derives decoded symbol data using past subset outputs instead of decoded bits themselves.

* * * * *